(12) United States Patent
Walker et al.

(10) Patent No.: US 9,348,358 B2
(45) Date of Patent: May 24, 2016

(54) CLOCK MULTIPLICATION AND DISTRIBUTION

(71) Applicant: FUJITSU LIMITED, Kawasaki-shi, Kanagawa (JP)

(72) Inventors: William W. Walker, Los Gatos, CA (US); Pradip Thachile, San Jose, CA (US); Nikola Nedovic, San Jose, CA (US)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/256,810

(22) Filed: Apr. 18, 2014

(65) Prior Publication Data

US 2015/0301557 A1      Oct. 22, 2015

(51) Int. Cl.
| | |
|---|---|
| H03D 3/24 | (2006.01) |
| G06F 1/10 | (2006.01) |
| H04L 7/033 | (2006.01) |
| H04B 1/40 | (2015.01) |
| H03L 7/089 | (2006.01) |
| H03L 7/093 | (2006.01) |
| H03L 7/099 | (2006.01) |
| H03L 7/22 | (2006.01) |

(52) U.S. Cl.
CPC ............... *G06F 1/10* (2013.01); *H03L 7/0898* (2013.01); *H03L 7/093* (2013.01); *H03L 7/099* (2013.01); *H03L 7/22* (2013.01); *H04B 1/40* (2013.01); *H04L 7/0331* (2013.01); *H03L 2207/06* (2013.01)

(58) Field of Classification Search
CPC ............... G06F 1/10; G06F 1/04; G06F 1/06; G06F 1/12; H03L 7/08; H03L 7/0891; H03L 7/093; H03L 7/087; H03L 7/18; H03L 7/0898; H03L 7/099; H03L 7/22; H03L 2207/06; H04L 7/0331; H04L 7/033; H04B 1/40

USPC .................................. 375/373, 374, 375, 376
See application file for complete search history.

(56) References Cited

U.S. PATENT DOCUMENTS

| | | | |
|---|---|---|---|
| 8,102,196 B1* | 1/2012 | Zhang ........................... | 327/156 |
| 8,878,580 B1* | 11/2014 | Gaskins et al. ............... | 327/156 |
| 2006/0001494 A1* | 1/2006 | Garlepp et al. ................... | 331/2 |
| 2013/0086410 A1* | 4/2013 | Kurd et al. ..................... | 713/501 |
| 2013/0285722 A1 | 10/2013 | Chou | |

FOREIGN PATENT DOCUMENTS

EP    1 845 622 A2    10/2007

OTHER PUBLICATIONS

N Nedovic, et al, "A 3W 39.8-44.6 Gb/s Dual-Mode SFI5.2 SerDes Chip Set in 65 nm CMOS", IEEE JSSC, vol. 45, No. 10, pp. 2016-2019, Oct. 2010.

* cited by examiner

*Primary Examiner* — Phuong Phu
(74) *Attorney, Agent, or Firm* — Maschoff Brennan

(57) ABSTRACT

A clock multiplication and distribution system includes a first phase-lock-loop circuit, a second phase-lock-loop circuit, and a clock distribution network that electrically couples the first phase-lock-loop circuit and the second phase-lock-loop circuit. The first phase-lock-loop circuit may include a first feedback loop that includes a first integer divider circuit and may be configured to generate a first clock using a reference clock. A frequency of the first clock may be greater than a frequency of the reference clock. The second phase-lock-loop circuit may include a second feedback loop that includes a second integer divider circuit and may be configured to generate a second clock using the first clock. A frequency of the second clock may be greater than the frequency of the first clock.

16 Claims, 10 Drawing Sheets

CLOCK MULTIPLICATION AND DISTRIBUTION

FIELD

The embodiments discussed herein are related to clock multiplication and distribution.

BACKGROUND

Many devices use high-speed input/output (I/O) ports to transmit information to or receive information from other devices. In some circumstances, the high-speed I/O ports may be grouped together, which each high-speed I/O port using a single lane of the group of high-speed I/O ports. Each of the high-speed I/O ports may be provided with a high-speed clock to clock the data being transmitted to or received from the other devices. These high-speed I/O ports may operate at much higher speeds than the processing speeds used in the transmitting or receiving devices. As a result, higher speed clocks may be generated for the high-speed I/O ports.

The subject matter claimed herein is not limited to embodiments that solve any disadvantages or that operate only in environments such as those described above. Rather, this background is only provided to illustrate one example technology area where some embodiments described herein may be practiced.

SUMMARY

According to an aspect of an embodiment, a clock multiplication and distribution system may include a first phase-lock-loop circuit, a second phase-lock-loop circuit, and a clock distribution network that electrically couples the first phase-lock-loop circuit and the second phase-lock-loop circuit. The first phase-lock-loop circuit may include a first feedback loop that includes a first integer divider circuit and may be configured to generate a first clock using a reference clock. A frequency of the first clock may be greater than a frequency of the reference clock. The second phase-lock-loop circuit may include a second feedback loop that includes a second integer divider circuit and may be configured to generate a second clock using the first clock. A frequency of the second clock may be greater than the frequency of the first clock.

The object and advantages of the embodiments will be realized and achieved at least by the elements, features, and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

Example embodiments will be described and explained with additional specificity and detail through the use of the accompanying drawings in which.

DESCRIPTION OF EMBODIMENTS

According to an aspect of an embodiment, a clock multiplication and distribution system may be configured to multiply a reference clock to an intermediate frequency and distribute the intermediate frequency clock to multiple different locations. At each of the different locations, the intermediate frequency clocks may be multiplied again to a final frequency. For example, the clock multiplication and distribution system may be configured to multiply a reference clock to an intermediate frequency and distribute the intermediate frequency clock to multiple lanes of a high-speed input, output, or input/output (I/O) port. Each lane of the I/O port may independently multiply the intermediate frequency clock to a final frequency clock for use in the corresponding lane.

As another example, a reference clock may be a 500 megahertz (MHz) clock. The reference clock may be multiplied by 7 to become a 3.5 gigahertz (GHz) clock that may be distributed to the multiple different locations. Each of the multiple different locations may multiply the distributed clock clocks by 8 to generate a 28 GHz clock at each of the multiple different locations.

To multiply and distribute the clocks, the clock multiplication and distribution system may include a first phase-locked-loop (PLL) circuit that may be electrically coupled to multiple secondary PLL circuits at the multiple different locations by a clock distribution network that includes one or more repeaters. The first PLL circuit may include a feedback loop with an integer divider circuit and may be configured to generate a first clock using the reference clock. The first clock may be distributed to each of the secondary PLL circuits.

Each of the multiple secondary PLL circuits may also include a feedback loop with an integer divider circuit and may each be configured to generate a second clock using the received first clock. Frequencies of the second clocks may be greater than the frequency of the first clock.

Embodiments of the present disclosure will be explained with reference to the accompanying drawings.

Figure 1:
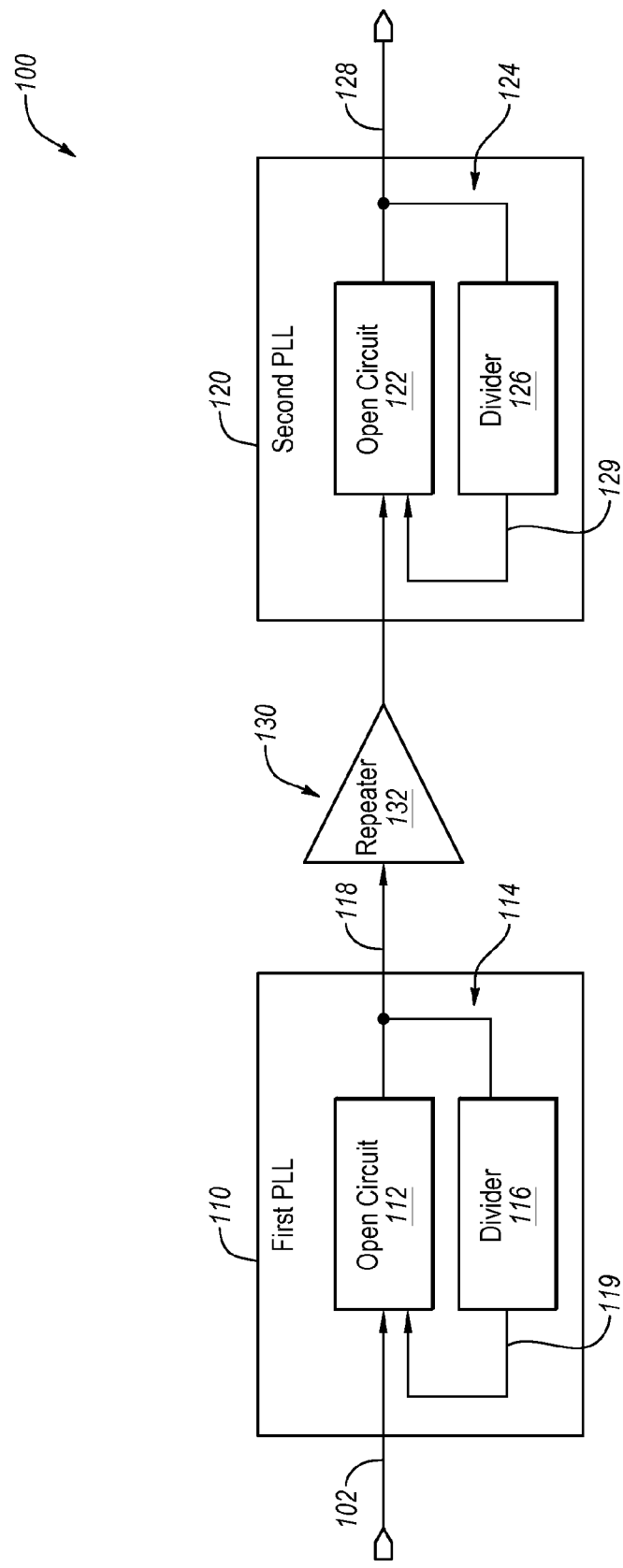
FIG. 1 is a block diagram of an example clock multiplication and distribution system.

FIG. 1 is a block diagram of an example clock multiplication and distribution system (referred to hereinafter as "the system 100"), arranged in accordance with at least one embodiment described herein. The system 100 includes a first PLL circuit 110, a secondary PLL circuit 120, and a clock distribution network 130 (referred to hereinafter as "the network 130") that includes a clock repeater 132 that electrically couples the first PLL circuit 110 and the secondary PLL circuit 120.

The first PLL circuit 110 may include an open circuit portion 112 (referred to hereinafter as "the portion 112") and a feedback loop 114. The feedback loop 114 may include an integer divider circuit 116 (referred to hereinafter as "the divider 116"). The first PLL circuit 110 may be configured to generate a first clock 118 based on the reference clock 102. The first clock 118 may be provided to the divider 116 and to the network 130.

The divider 116 may be configured to generate a feedback clock 119 using the first clock 118 and to provide the feedback clock 119 to the portion 112. The divider 116 may include an integer divider that divides a frequency of the first clock 118 by an integer divisor greater than 1 to generate the feedback clock 119. For example, the first clock 118 may include a 4 GHz clock and the divider 116 may be set with an integer divider of 8. In these and other embodiments, the feedback clock 119 may be a 0.5 GHz clock as a result of dividing the 4 GHz first clock 118 by 8.

The portion 112 may compare a phase of the feedback clock 119 and a phase of the reference clock 102 to generate a phase difference. Based on the phase difference, the portion 112 may adjust a frequency/phase of the first clock 118 to drive the phase of the feedback clock 119 to approximate the phase of the reference clock 102. Because phase is the integral of frequency, the first PLL circuit 110 may operate to drive the frequency of the first clock 118 to an integer multiple or integer multiplication factor of the reference clock 102, where the integer multiple or multiplication factor is the divisor in the divider 116. For example, if the reference clock 102 is a 1 GHz clock and the divisor is 7, the first PLL circuit 110 in a locked state may generate a first clock 118 with a frequency of 7 GHz.

The network 130 may include the clock repeater 132 and one or more traces that are configured to provide the first clock 118 to the secondary PLL circuit 120. In some embodiments, the network 130 may not include the clock repeater 132. In these and other embodiments, a distance that the first clock 118 may traverse between the first and secondary PLL circuits 110 and 120 may be such that a time delay and/or attenuation of the first clock 118 in the network 130 are acceptable for the system 100. When the distance between the first and secondary PLL circuits 110 and 120 causes clock delays and/or attenuation of the first clock 118 that may be unacceptable, the network 130 may include the clock repeater 132. The clock repeater 132 may operate to reduce a time delay and/or attenuation of the first clock 118 while the first clock 118 is transmitted from the first PLL circuit 110 to the secondary PLL circuit 120.

The clock repeater 132 may include a complementary metal-oxide-semiconductor (CMOS) source-coupled-logic repeater, otherwise known as a current-mode logic (CML) repeater. Alternately or additionally, the clock repeater may include a CMOS inverter repeater.

The secondary PLL circuit 120 may include an open circuit portion 122 (referred to hereinafter as "the portion 122") and a feedback loop 124. The feedback loop 124 may include an integer divider circuit 126 (referred to hereinafter as "the divider 126"). The secondary PLL circuit 120 may be configured to generate a second clock 128 based on the first clock 118. The second clock 128 may be provided to the divider 126 and output to another circuit or system, such as a transceiver port in a lane of a high-speed I/O system.

The divider 126 may be configured to generate a feedback clock 129 using the second clock 128 and to provide the feedback clock 129 to the portion 122. The divider 126 may include an integer divider that divides a frequency of the first clock 118 by an integer divisor greater than 1 to generate the feedback clock 129.

The portion 122 may compare a phase of the feedback clock 129 and a phase of the first clock 118 to generate a phase difference. Based on the phase difference, the portion 122 may adjust a frequency/phase of the second clock 128 to drive the phase of the feedback clock 129 to approximate the phase of the first clock 118. The secondary PLL circuit 120 may thus operate to drive the frequency of the second clock 128 to an integer multiple or integer multiplication factor of the first clock 118, where the integer multiple or multiplication factor is the divisor in the divider 126.

The second clock 128 distributed by the system 100 may have less jitter than other clocks distributed by previous clock distribution systems. Alternately or additionally, the system 100 may distribute the second clock 128 with an equal amount of jitter or less jitter than previous clock distribution systems while consuming less power than the previous clock distribution systems. Alternately or additionally, the system 100 may be more easily tuned to reduce jitter of a distributed clock than previous clock distribution systems.

For example, previous clock distribution systems may generate a high frequency clock at a particular operating frequency from a reference clock and may distribute the high frequency clock through a clock distribution network to a different location. These distribution systems may consume a large amount of power and area to distribute the high frequency clock and may utilize a separate conditioned power supply. Furthermore, distributing a high frequency clock may result in distortion of the duty cycle of the high frequency clock. Other previous clock distribution systems may distribute a reference clock to multiple locations and at each of the multiple locations multiply the reference clock to generate the high frequency clocks. In both of these previous clock distribution systems, multiplying a reference clock with a large multiplication factor, e.g., a multiplication factor greater than 15, 20, or 25, may result in increased jitter of the high frequency clock. Furthermore, both of these previous clock distribution systems employ a single unit, such as a PLL, that multiplies the reference clock. As a result, there is limited ability to tune parameters of the unit to adjust the jitter of the high frequency clock in the previous clock distribution systems.

The system 100 illustrated in FIG. 1 may employ the first PLL circuit 110 to multiply the reference clock 102 to generate the first clock 118. The first clock 118 may be distributed to the secondary PLL circuit 120 that may be employed to multiply the first clock 118 to generate the second clock 128. As a result, a high frequency clock, e.g., the second clock 128, may be provided to a location with reduced jitter, power usage, duty cycle distortion, and/or other distortions of the high frequency clock. In particular, the high frequency clock may be provided to a location with reduced jitter, power usage, duty cycle distortion, and/or other distortions when the location is sufficiently far from a reference clock from which the high frequency clock is derived such that a clock repeater is employed to reduce degradation and delay of the clock. In these and other embodiments, a high frequency clock may be a clock with a frequency of greater than approximately 5, 10, 15, 20, or some other frequency GHz.

Because both the first PLL circuit 110 and the secondary PLL circuit 120 multiply clocks to generate the second clock 128, the multiplication factors, e.g., the divisors, in the first PLL circuit 110 and the secondary PLL circuit 120 may be smaller than the individual multiplication factors in other systems. Using smaller multiplication factors to multiply clocks to generate the second clock 128 may reduce the jitter of the second clock 128.

Furthermore, because both of the first PLL circuit 110 and the secondary PLL circuit 120 multiply clocks to generate the second clock 128, the network 130 may carry a clock with a frequency that is less than a frequency of a clock distributed in previous clock distribution systems. The reduced frequency of the first clock 118 carried by the network 130 may reduce the power consumption of the network 130 and/or the footprint of the network 130 because inductive peaking or other bandwidth broadening techniques may not be applied to the network 130 to distribute the first clock 118 to the secondary PLL circuit 120.

In some embodiments, the multiplication factor, e.g., the divisor, of the first PLL circuit 110 may be greater than the multiplication factor of the secondary PLL circuit 120. As a result, the multiplication factor of the secondary PLL circuit 120 may be reduced as compared to other distribution system or other configurations of the system 100. Reducing the multiplication factor of the secondary PLL circuit 120 may result in less jitter of the second clock 128.

Furthermore, in some embodiments, a bandwidth of the secondary PLL circuit 120 may be reduced as compared to a bandwidth of the first PLL circuit 110. By reducing the bandwidth of the secondary PLL circuit 120, jitter of the second clock 128 contributed by the first clock 118 may be filtered and reduced. Because the jitter of the first clock 118 may be filtered by the secondary PLL circuit 120, jitter caused by the network 130 may have less effect on the jitter of the second clock 128. Jitter caused by the network 130 having less effect on the second clock 128 may reduce the design complexity of the network 130.

Additionally, the system 100 including both the first and secondary PLL circuits 110 and 120 may increase the ability of the system 100 to tune conditions of the system 100 to decrease the jitter of the second clock 128. In previous clock distribution systems with a single unit that multiplies a clock, conditions, such as a bandwidth and damping factor, of the unit may be tuned to adjust the jitter of a clock. In the system 100, however, the conditions of each of the first and secondary PLL circuits 110 and 120 may be tuned individually to decrease the jitter. Increasing the number of conditions that may be tuned may provide the system 100 with better opportunities to adjust the system 100 to reduce the jitter of the second clock 128.

Modifications, additions, or omissions may be made to the system 100 without departing from the scope of the present disclosure. For example, the network 130 may not include the repeater 132 or may include multiple repeaters. Alternately or additionally, the system 100 may include one or more other passive or active components or circuits than those illustrated in the system 100. For example, the system 100 may be expandable to include multiple secondary PLL circuits 120 in different locations that each receive the first clock 118 from the first PLL circuit 110 through the network 130.

Figure 2:
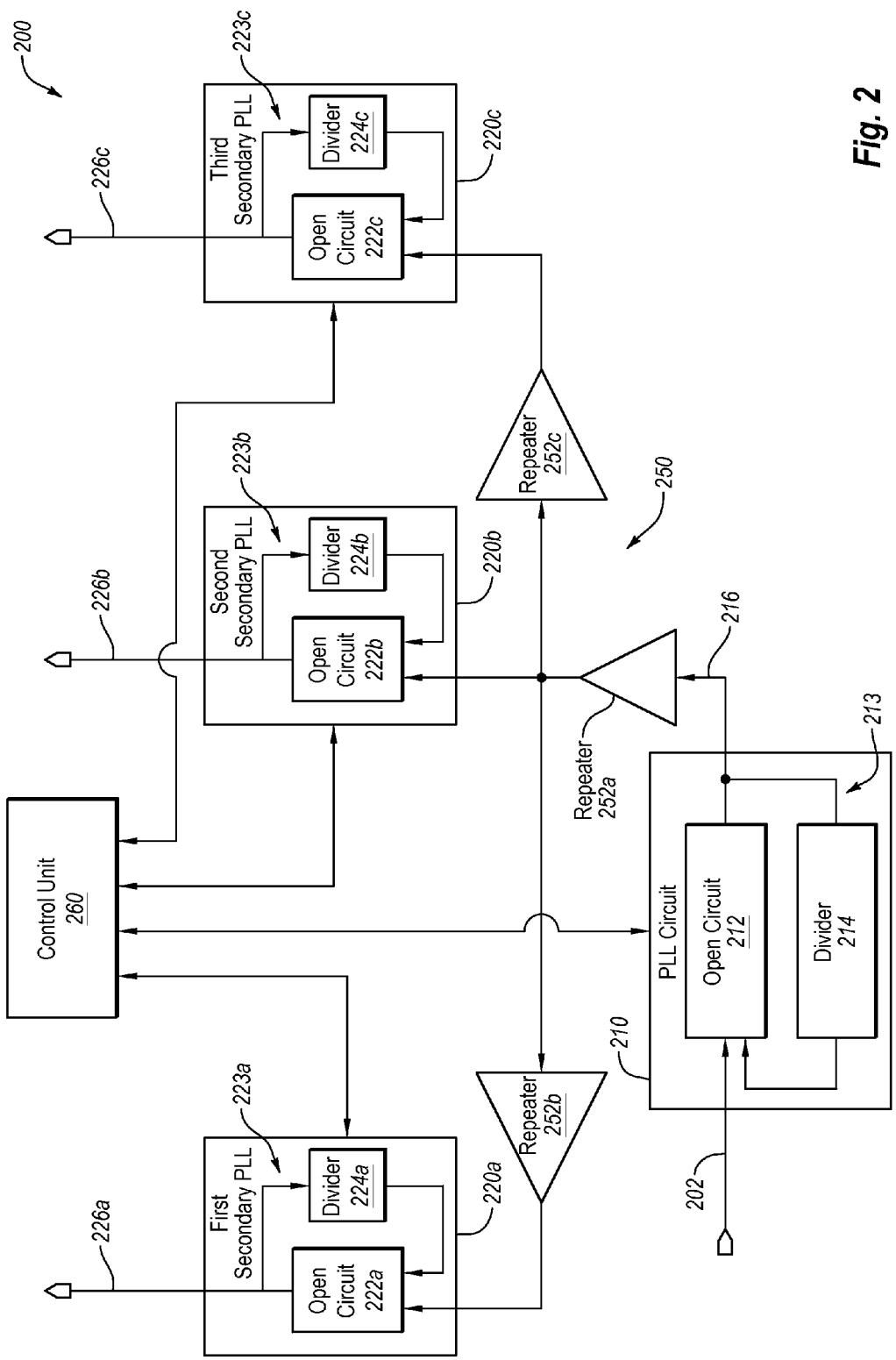
FIG. 2 is a block diagram of another example clock multiplication and distribution system.

FIG. 2 is a block diagram of another example clock multiplication and distribution system 200 (referred to herein as "the system 200"), arranged in accordance with at least one embodiment described herein. The system 200 includes a first PLL circuit 210; a clock distribution network 250; first, second, and third secondary PLL circuits 220a, 220b, and 220c (referred to herein as "the secondary PLL circuit(s) 220); and a control unit 260.

The first PLL circuit 210 may include an open circuit portion 212 (referred to hereinafter as "the portion 212") and a feedback loop 213. The feedback loop 213 may include an integer divider circuit 214 (referred to hereinafter as "the divider 214"). The first PLL circuit 210 may be configured to generate a first clock 216 based on the reference clock 202. The frequency of the first clock 216 may be based on the frequency of the reference clock 202 and the divisor of the divider 214. The first PLL circuit 210 may operate in an analogous manner as the first PLL circuit 110 of FIG. 1.

The first secondary PLL circuit 220a may include a first open circuit portion 222a (referred to hereinafter as "the first portion 222a") and a first feedback loop 223a. The first feedback loop 223a may include a first integer divider circuit 224a (referred to hereinafter as "the first divider 224a"). The first secondary PLL circuit 220a may be configured to generate a first secondary clock 226a based on the first clock 216. The frequency of the first secondary clock 226a may be based on the frequency of the first clock 216 and the divisor of the first divider 224a.

The second secondary PLL circuit 220b may include a second open circuit portion 222b (referred to hereinafter as "the second portion 222b") and a second feedback loop 223b. The second feedback loop 223b may include a second integer divider circuit 224b (referred to hereinafter as "the second divider 224b"). The second secondary PLL circuit 220b may be configured to generate a second secondary clock 226b based on the first clock 216. The frequency of the second secondary clock 226b may be based on the frequency of the first clock 216 and the divisor of the second divider 224b.

The third secondary PLL circuit 220c may include a third open circuit portion 222c (referred to hereinafter as "the third portion 222c") and a third feedback loop 223c. The third feedback loop 223c may include a third integer divider circuit 224c (referred to hereinafter as "the third divider 224c"). The third secondary PLL circuit 220c may be configured to generate a third secondary clock 226c based on the first clock 216. The frequency of the third secondary clock 226c may be based on the frequency of the first clock 216 and the divisor of the third divider 224c. Each of the secondary PLL circuits 220 may operate in an analogous manner as the secondary PLL circuit 120 of the FIG. 1.

The first portion 222a, the second portion 222b, and the third portion 222c may be referred to hereinafter as "the portion(s) 222." The first feedback loop 223a, the second feedback loop 223b, and the third feedback loop 223c may be referred to hereinafter as the "feedback loop(s) 223." The first divider 224a, the second divider 224b, and the third divider 224c may be referred to herein as "the divider(s) 224." The first secondary clock 226a, the second secondary clock 226b, and the third secondary clock 226c may be referred to herein as "the secondary clock(s) 226."

In some embodiments, the integer divisors of the dividers 224 of the secondary PLL circuits 220 may be the same or different. As a result, a frequency of each of the secondary clocks 226 may be approximately the same or different.

The clock distribution network 250 may include first, second, and third clock repeaters 252a, 252b, and 252c (referred to hereinafter as "the clock repeater(s) 252") and one or more traces that are configured to provide the first clock 218 to the secondary PLL circuits 220. Each of the clock repeaters 252 may include an emitter-coupled-logic repeater, a CMOS repeater, or the clock repeaters 252 may include some combination thereof.

The first clock repeater 252a may provide the first clock 216 to the second secondary PLL circuit 220b and to the second and third clock repeaters 252b and 252c. The second clock repeater 252b may provide the first clock 216 to the first secondary PLL circuit 220a. The third clock repeater 252c may provide the first clock 216 to the third secondary PLL circuit 220c.

The control unit 260 may be configured to monitor the jitter of the secondary clocks 226. Based on the jitter on the secondary clocks 226, the control unit 260 may adjust conditions of the secondary PLL circuits 220 and the first PLL circuit 210 to adjust the jitter of the secondary clocks 226.

To monitor the jitter of the secondary clocks 226, the control unit 260 may monitor the secondary clocks 226. For example, the control unit 260 may obtain an indication of the jitter of the secondary clocks 226 from circuits configured to monitor the jitter of the secondary clocks 226. Alternately or additionally, the control unit 260 may obtain an indication of the jitter of the secondary clocks 226 from data signals that are clocked with the secondary clocks 226. In these and other embodiments, the jitter of the secondary clocks 226 may be an indication of an amount that the clock edges of the secondary clocks 226 move in time from a set time interval for the clock edges based on a frequency of the secondary clocks 226.

In response to the jitter of one or more of the secondary clocks 226 being above a threshold, the control unit 260 may adjust conditions of one or more of the secondary PLL circuits 220 and/or the first PLL circuit 210. The threshold may be based on the characteristics of the hardware using the secondary clocks 226. For example, some hardware may tolerate jitter that is less than 5, 10, 15, or some other percent of a cycle of the secondary clocks 226. In these and other embodiments, the threshold may be equal to the jitter tolerance of the hardware using the secondary clocks 226. Alternately or additionally, the threshold may be based on the jitter tolerance of the hardware using the secondary clocks 226. For example, when the jitter tolerance is 10 percent of a cycle of the secondary clocks 226 and the jitter reaches 7 percent of the cycle, the control unit 260 may adjust conditions of one or more of the secondary PLL circuits 220 and/or the first PLL circuit 210.

In some embodiments, the conditions of the secondary PLL circuits 220 and the first PLL circuit 210 that may be adjusted by the control unit 260 may include the bandwidth and the damping factor of the secondary PLL circuits 220 and the first PLL circuit 210. In these and other embodiments, the control unit 260 may adjust these conditions by adjusting one or more parameters of the secondary PLL circuits 220 and the first PLL circuit 210. The parameters may include an oscillator gain, a charge pump gain, loop filter parameters, which may be based on a resistance and/or a capacitance of a loop filter, and divisors of the dividers 224 and the divider 214, among others.

The control unit 260 may adjust the conditions of each of the secondary PLL circuits 220 and the first PLL circuit 210 individually or collectively. Alternately or additionally, the control unit 260 may adjust the conditions of each of the secondary PLL circuits 220 and the first PLL circuit 210 to achieve jitter that is above a threshold for each of the secondary clocks 226. Alternately or additionally, the control unit 260 may adjust the conditions of each of the secondary PLL circuits 220 and the first PLL circuit 210 to achieve jitter that may be optimized for one or more of the secondary clocks 226 and not others of the secondary clocks 226.

In some embodiments, when the jitter of one of the secondary clocks 226 is above the threshold, the control unit 260 may adjust the conditions of each secondary PLL circuit 220 and the first PLL circuit 210. Alternately or additionally, the control unit 260 may adjust the conditions for the secondary PLL circuit 220 that generates the one of the secondary clocks 226 that is above the threshold.

Alternately or additionally, the control unit 260 may first adjust the conditions for the secondary PLL circuit 220 that generates the one of the secondary clocks 226 with jitter above the threshold. If the conditions of the secondary PLL circuit 220 may not be adjusted to reduce the jitter below the threshold, the control unit 260 may further adjust the conditions of the first PLL circuit 210 and the secondary PLL circuit 220 until the jitter of the one of the secondary clocks 226 is below the threshold.

Adjusting the conditions of the first PLL circuit 210 may affect the jitter of other of the secondary clocks 226. Thus, the control unit 260 may monitor the effect of the adjustment of the first PLL circuit 210 on the jitter of the other secondary clocks 226. When the jitter of the other secondary clocks 226 may be affected such that their jitter may be increased above the threshold, the control unit 260 may adjust the conditions of the secondary PLL circuits 220 that generate the other secondary clocks 226 with jitter above the threshold individually or may adjust the conditions of each of the secondary PLL circuits 220 and the first PLL circuit 210 to achieve jitter that may be below the threshold for each of the secondary clocks 226.

By adjusting the conditions of the secondary PLL circuit 220 and the first PLL circuit 210, the control unit 260 may adapt the system 200 for changing conditions. For example, a change in temperature, voltage, electromagnetic disturbance, noise, or some other variable in the system 200 may change. Changes in the system 200 may affect the jitter of the secondary clocks 226. The control unit 260 may adjust the conditions of the secondary PLL circuit 220 and the first PLL circuit 210 to help to reduce or account for the change in the jitter of the secondary clocks 226. In these and other embodiments, the control unit 260 may monitor the secondary clocks 226 in real-time during operation of the system 200 and may adjust the system 200 accordingly. Alternately or additionally, the control unit 260 may operate at power-up or at some other set or variable operation interval of the system 200. Alternately or additionally, the control unit 260 may function to adjust the conditions of the secondary PLL circuit 220 and the first PLL circuit 210 after fabrication to account for variations in the fabrication of the system 200. In these and other embodiments, the control unit 260 may set the conditions for the secondary PLL circuit 220 and the first PLL circuit 210 after fabrication that may be used during all future operations of the system 200.

Modifications, additions, or omissions may be made to the system 200 without departing from the scope of the present disclosure. For example, the system 200 may include fewer or more than the three secondary PLL circuits 220. In these and other embodiments, each of the secondary PLL circuits 220 may receive the first clock 216 from the first PLL circuit 210 and may have their conditions controlled by the control unit 260.

In some embodiments, the system 200 may not include the control unit 260. In these and other embodiments, the system 200 may be simulated and analyzed and the conditions of the secondary PLL circuits 220 and the first PLL circuit 210 may be set before fabrication of the system 200.

Figure 3A:
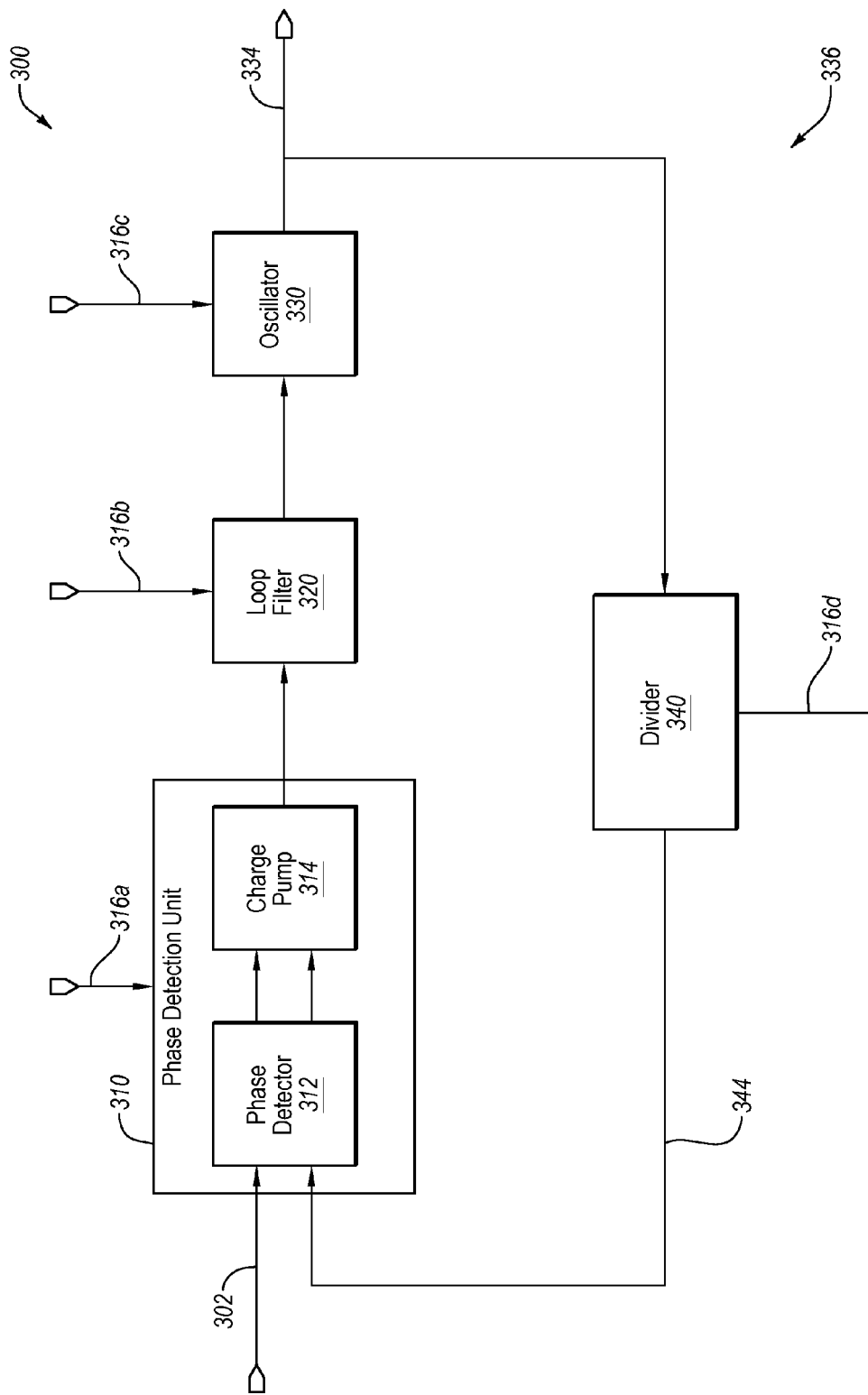
FIG. 3A is a block diagram of an example phase-lock-loop circuit.

FIG. 3A is a block diagram of an example PLL circuit 300 (referred to hereinafter as "circuit 300"), arranged in accordance with at least one embodiment described herein. The circuit 300 may be an example of the first and/or secondary PLL circuits 110 and 120 of FIG. 1, the first PLL circuit 210 of FIG. 2, and/or any of the secondary PLL circuits 220 of FIG. 2. The circuit 300 includes a phase detection unit 310, a loop filter circuit 320, an oscillator circuit 330, and a divider circuit 340.

The phase detection unit 310 may include a phase detector circuit 312 and a charge pump circuit 314. The phase detector circuit 312 may output a voltage that may be proportional to a phase error between a reference clock 302 and a divided output clock 344 from the divider circuit 340. The voltage may be provided to the charge pump circuit 314 that converts the voltage to a current that may be an average of the phase error between the reference clock 302 and the divided output clock 344. The charge pump circuit 314 provides the current to the loop filter circuit 320. The loop filter circuit 320 filters the current and converts the current to a voltage that may be provided to the oscillator circuit 330. The oscillator circuit 330 generates the output clock 334 with a frequency proportional to the voltage provided by the loop filter circuit 320. The output clock 334 may also be provided to the divider circuit 340. The divider circuit 340 divides the output clock 334, e.g., reduces the frequency of the output clock 334 proportional to a divisor of the divider circuit 340, and provides the divided output clock 344 to the phase detector circuit 312.

FIG. 3A further illustrates controls signals 316 that are configured to adjust parameters of the phase detection unit 310, the loop filter circuit 320, the oscillator circuit 330, and the divider circuit 340. The control signals 316 may be generated by a control unit, such as the control unit 260 of FIG. 2. The control signals 316 may include a first control signal 316a that may adjust parameters of the phase detection unit 310. The adjustable parameters of the phase detection unit 310 may include a gain of the phase detection unit 310. In particular, a gain of the charge pump circuit 314 may be adjusted by adjusting a reference current used by the charge pump circuit 314. The phase detection unit 310 is illustrated as an analog device. In some embodiments, the phase detection unit 310 may be digital. In these and other embodiments, a gain of the output of the phase detection unit 310 may be adjusted by the first control signal 316a.

The control signals 316 may also include a second control signal 316b that may adjust the parameters of the loop filter circuit 320. The adjustable parameter of the loop filter circuit 320 may include one or more capacitances in the loop filter circuit 320, a resistance in the loop filter circuit 320, or some other passive component value in the loop filter circuit 320. In some embodiments, the loop filter circuit 320 may be digital. In these and other embodiments, a gain of the loop filter circuit 320 or some other variable of the loop filter circuit 320 may be adjusted by the second control signal 316b.

The control signals 316 may also include a third control signal 316c that may adjust the parameters of the oscillator circuit 330. The adjustable parameters of the oscillator circuit 330 may include a gain of the oscillator circuit 330. The gain of the oscillator circuit 330 may indicate an amount that a change in the voltage received from the loop filter circuit 320 changes the frequency of the output clock 334.

The control signals 316 may also include a fourth control signal 316d that may adjust the parameters of the divider circuit 340. The adjustable parameters of the divider circuit 340 may include a value of the divisor of the divider circuit 340.

Adjusting the parameters of the phase detection unit 310, the loop filter circuit 320, the oscillator circuit 330, and the divider circuit 340 may adjust conditions of the circuit 300. In particular, adjusting the parameters of the phase detection unit 310, the loop filter circuit 320, the oscillator circuit 330, and the divider circuit 340 may adjust a bandwidth and a damping factor of the circuit 300.

The bandwidth of the circuit 300 may be proportional to the natural frequency, given by the following equation:

$$\omega = \sqrt{\frac{K_{PD} \times K_{VCO}}{N \times C_0}}$$

where $\omega$ is the natural frequency, $K_{PD}$ is the gain of the phase detection unit 310, $K_{VCO}$ is the gain of the oscillator circuit 330, N is the divisor of the divider circuit 340, and $C_0$ is the value of a capacitor in the loop filter circuit 320. Thus, adjusting the natural frequency of the circuit 300 may adjust the bandwidth of the circuit 300.

The damping factor of the circuit 300 may be given by the following equation:

$$\zeta = \frac{r_0}{2} \sqrt{\frac{K_{PD} \times K_{VCO} \times C_0}{N}}$$

where $\zeta$ is the damping factor and $r_0$ is the value of a resistor in the loop filter circuit 320.

As may be determined from the above equations, the damping factor and the bandwidth of the circuit 300 may be affected by adjusting the parameters of any one of the phase detection unit 310, the loop filter circuit 320, the oscillator circuit 330, and the divider circuit 340. Furthermore, numerous of the parameters of the phase detection unit 310, the loop filter circuit 320, the oscillator circuit 330, and the divider circuit 340 may adjust the damping factor and the bandwidth. Thus, in some embodiments, both the bandwidth and the damping factor may be adjusted when a single parameter is adjusted.

In some embodiments, the jitter of the output clock 334 may be caused by jitter of the reference clock 302 and by jitter generated by the circuit 300. Adjusting the bandwidth of the circuit 300 may adjust an amount of jitter of the output clock 334 that results from the jitter of the reference clock 302 or the jitter generated by the circuit 300. For example, reducing the bandwidth may suppress the jitter of the reference clock 302 that may be transferred to the output clock 334 and may increase the jitter generated by the circuit 300 that may be transferred to the output clock 334. Conversely, increasing the bandwidth may increase the jitter of the reference clock 302 that may be transferred to the output clock 334 and may suppress the jitter generated by the circuit 300 that may be transferred to the output clock 334. As a result, the bandwidth of the circuit 300 may be adjusted to suppress the type of jitter that contributes the most to the jitter of the output clock 334.

For example, in the system 100 of FIG. 1, the divisor in the first PLL circuit 110 may be larger than the divisor in the secondary PLL circuit 120. As a result, the jitter generated by the first PLL circuit 110 may be larger than the jitter generated by the secondary PLL circuit 120. Furthermore, the jitter of the first clock 118 when received by the secondary PLL circuit 120 after the first clock 118 may be transferred by the network 130 may be greater than the jitter of the reference clock 102. As a result, the secondary PLL circuit 120 may have a bandwidth that may be lower than the bandwidth of the first PLL circuit 110 to allow the secondary PLL circuit 120 to suppress the jitter from the first clock 118 and to allow the first PLL circuit 110 to suppress the jitter generated by the first PLL circuit 110.

Modifications, additions, or omissions may be made to the circuit 300 without departing from the scope of the present disclosure. For example, the circuit 300 may be an analog PLL circuit, a digital PLL circuit, and/or an all-digital PLL circuit.

Figure 3B:
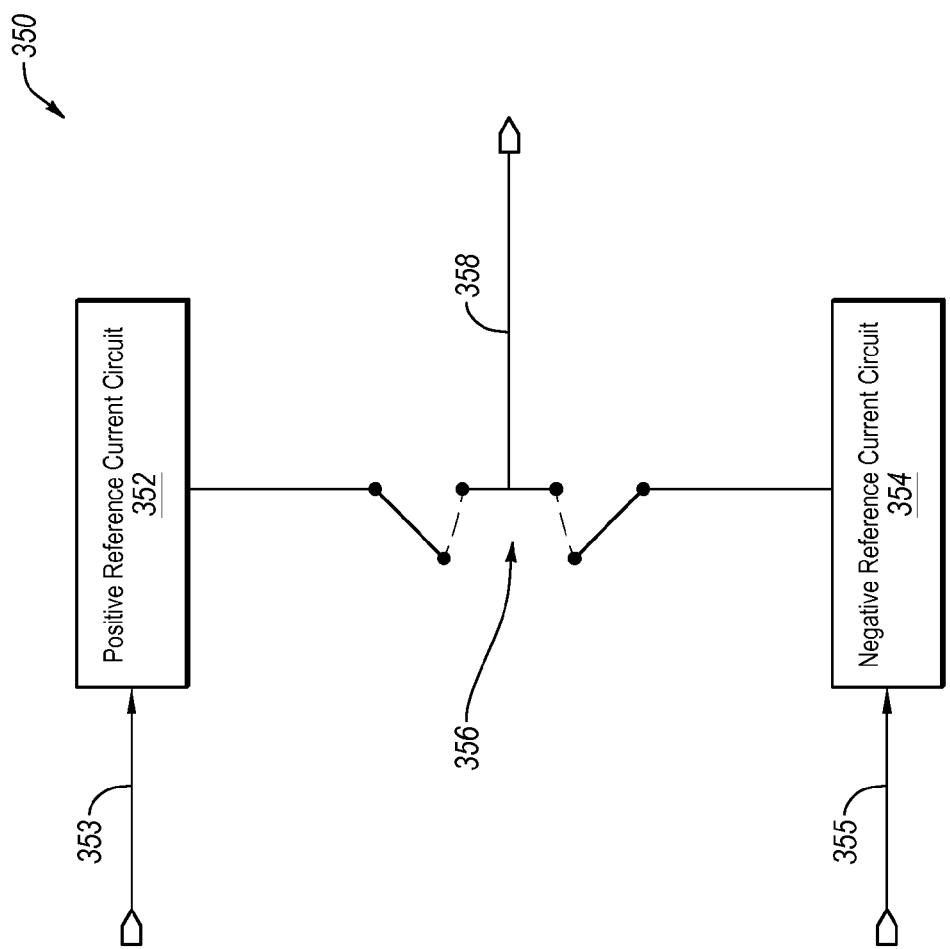
FIG. 3B is a block diagram of an example charge pump circuit.

FIG. 3B is a block diagram of an example charge pump circuit 350 that may be an example of the charge pump circuit 314 of FIG. 3A, arranged in accordance with at least one embodiment described herein. A parameter (or multiple parameters) of the charge pump circuit 350 may be adjusted. The parameter may include a reference current of the charge pump circuit 350, As illustrated, the charge pump circuit 350 includes a positive reference current circuit 352 and a negative reference current circuit 354 that are both used to generate an output current clock 358 based on the behavior of switches 356. A first adjust signal 353 may adjust a positive reference current output by the positive reference current circuit 352. A second adjust signal 355 may adjust a negative reference current output by the negative reference current circuit 354. Modifications, additions, or omissions may be made to the charge pump circuit 350 without departing from the scope of the present disclosure.

Figure 3C:
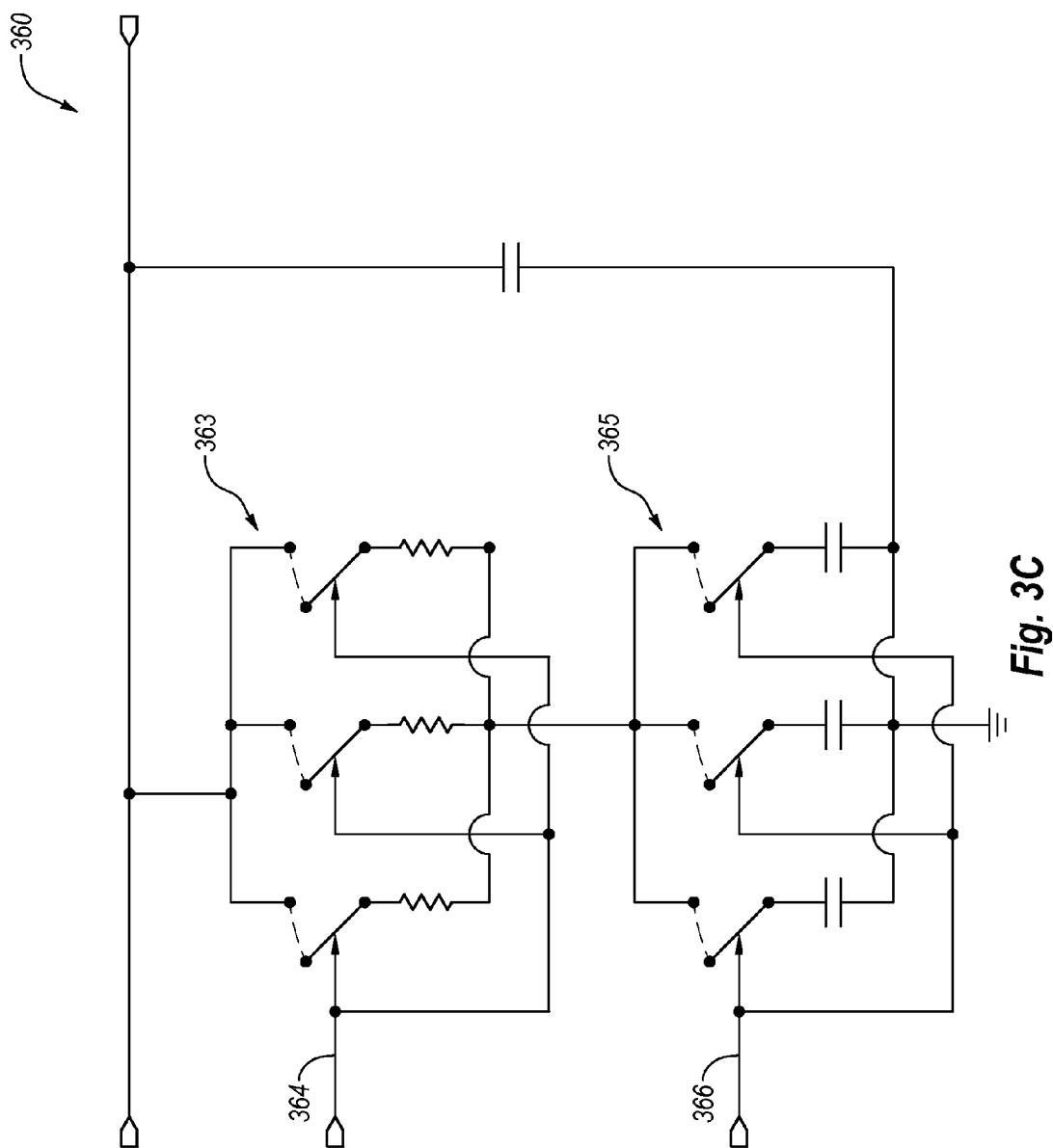
FIG. 3C is a circuit diagram of an example loop filter circuit.

FIG. 3C is a circuit diagram of an example loop filter circuit 360 that may be an example of the loop filter circuit 320 of FIG. 3A, arranged in accordance with at least one embodiment described herein. A parameter (or multiple parameters) of the loop filter circuit 360 may be adjusted. The parameter may include a resistance 363 and/or a capacitance 365 of the loop filter circuit 360. As illustrated, a first control signal 364 may open and or close switches to increase or decrease the resistance 363 of the loop filter circuit 360. A second control signal 366 may open and/or close other switches to increase or decrease the capacitance 365 of the loop filter circuit 360.

Modifications, additions, or omissions may be made to the loop filter circuit 360 without departing from the scope of the present disclosure. For example, the resistance 363 may include a variable resistor that may be controlled by the first control signal 364. Alternately or additionally, the capacitance 365 may include a varactor that may be controlled by the second control signal 366.

Figure 3D:
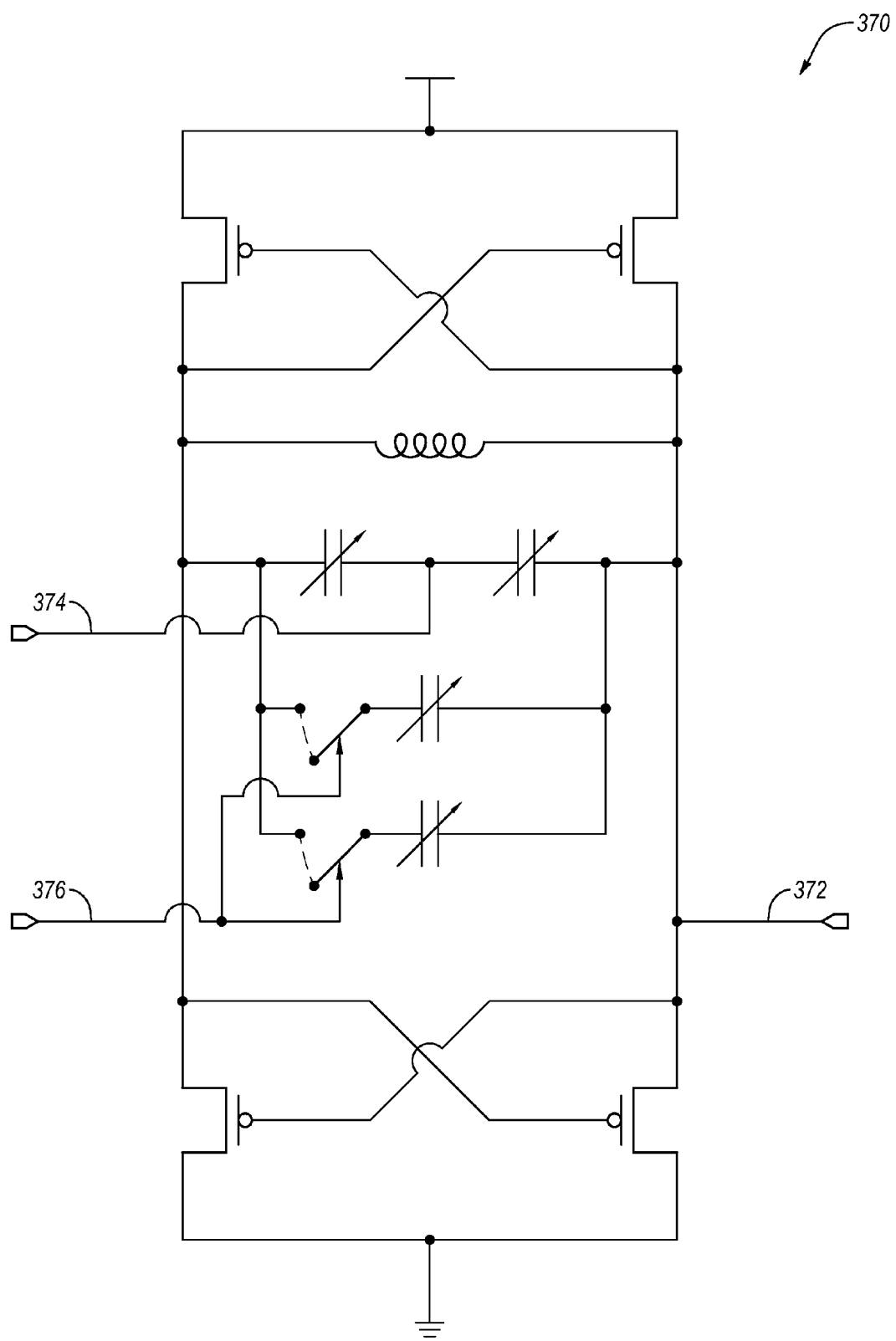
FIG. 3D is a circuit diagram of an example oscillator circuit.

FIG. 3D is a circuit diagram of an example oscillator circuit 370 that may be an example of the oscillator circuit 330 of FIG. 3A, arranged in accordance with at least one embodiment described herein. A parameter (or multiple parameters) of the oscillator circuit 370 may be adjusted. The parameter may include a gain of the oscillator circuit 370. The gain of the oscillator circuit 370 may be adjusted by a first control signal 376 that may adjust an amount of capacitance that may be switched into the oscillator circuit 370. Adjusting the capacitance of the oscillator circuit 370 may adjust how the oscillator circuit 370 adjusts a frequency of an output clock 372 with respect to a received voltage control signal 374 that tunes an amount of capacitance that may be switched into the oscillator circuit 370. Modifications, additions, or omissions may be made to the oscillator circuit 370 without departing from the scope of the present disclosure.

Figure 3E:
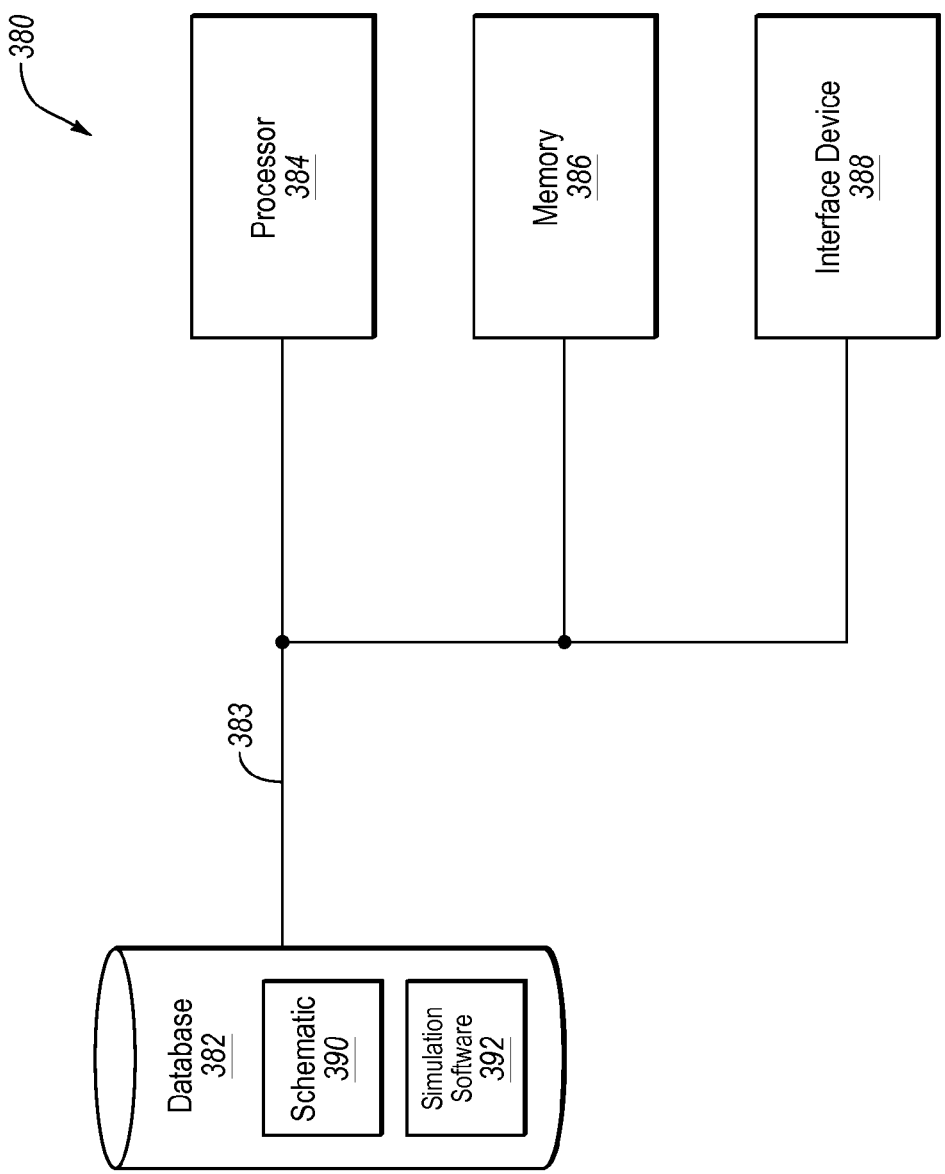
FIG. 3E is a block diagram of an example system for configuring a clock multiplication and distribution system.

FIG. 3E is a block diagram of an example system 380 for configuring a clock multiplication and distribution system (referred to hereinafter as "the system 380"), arranged in accordance with at least one embodiment described herein. The system 380 may be configured to adjust parameters of PLL circuits, such as the circuit 300 of FIG. 3A, in a clock multiplication and distribution system before the clock multiplication and distribution system may be manufactured in hardware. In these and other embodiments, based on a simulation of the clock multiplication and distribution system, the system 380 may be able to select parameters for the PLL circuits in the clock multiplication and distribution system that may result in the clocks output by the clock multiplication and distribution system including jitter less than a threshold.

The system 380 may include a database 382, a processor 384, a memory 386, and an interface device 388. The database 382, the processor 384, the memory 386, and the interface device 388 may be communicatively coupled by a bus or network 383.

The processor 384 may include, for example, a microprocessor, a microcontroller, a digital signal processor ("DSP"), an application-specific integrated circuit ("ASIC"), a Field-Programmable Gate Array ("FPGA"), or any other digital or analog circuitry configured to interpret and/or to execute program instructions and/or to process data. In some embodiments, the processor 384 may interpret and/or execute program instructions and/or process data stored in the associated memory 386. Although a single processor 384 is illustrated, the system 380 may include multiple processors.

The memory 386 may include any suitable computer-readable media configured to retain program instructions and/or data for a duration of time. By way of example, and not limitation, such computer-readable media may include tangible and/or non-transitory computer-readable storage media, including Random Access Memory ("RAM"), Read-Only Memory ("ROM"), Electrically Erasable Programmable Read-Only Memory ("EEPROM"), Compact Disk Read-Only Memory ("CD-ROM") or other optical disk storage, magnetic disk storage or other magnetic storage devices, flash memory devices (e.g., solid state memory devices), or any other storage medium which may be used to carry or store desired program code in the form of computer-executable instructions or data structures and which may be accessed by the processor 384. Combinations of the above may also be included within the scope of computer-readable media. Computer-executable instructions may include, for example, instructions and data that cause a general-purpose computer, special-purpose computer, or special-purpose processing device (e.g., the processor 384) to perform a certain function or group of functions.

The database 382 may include a schematic representation 390 of a clock multiplication and distribution system and simulation software 392. The simulation software 392 may include computer instructions, that when executed by a processor, such as the processor 384, may simulate the schematic representation 390 to estimate jitter of an output clock of the schematic representation 390 of the clock multiplication and distribution system. Various parameters of the schematic representation 390 may be adjusted during the simulation to adjust the jitter of the output clock as described herein. Values of the parameters that result in the jitter being less than a threshold during the simulation of the schematic representation 390 may be noted and used during fabrication of the clock multiplication and distribution system in hardware. In this manner, the parameters of the clock multiplication and distribution system may be adjusted prior to fabrication to achieve jitter less than a threshold.

In these and other embodiments, the computer instructions executed by the processor 384 may be loaded into the memory 386 for execution by the processor 384 and/or data generated, received, or operated on during simulation of the schematic representation 390 herein may be at least temporarily stored in the memory 386. The interface device 388 may be configured to receive data, such as parameters of the clock multiplication and distribution system, from and/or to send data to other systems, users, and/or other processes over any type of communications network. Modifications, additions, or omissions may be made to the system 380 without departing from the scope of the present disclosure.

Figure 4:
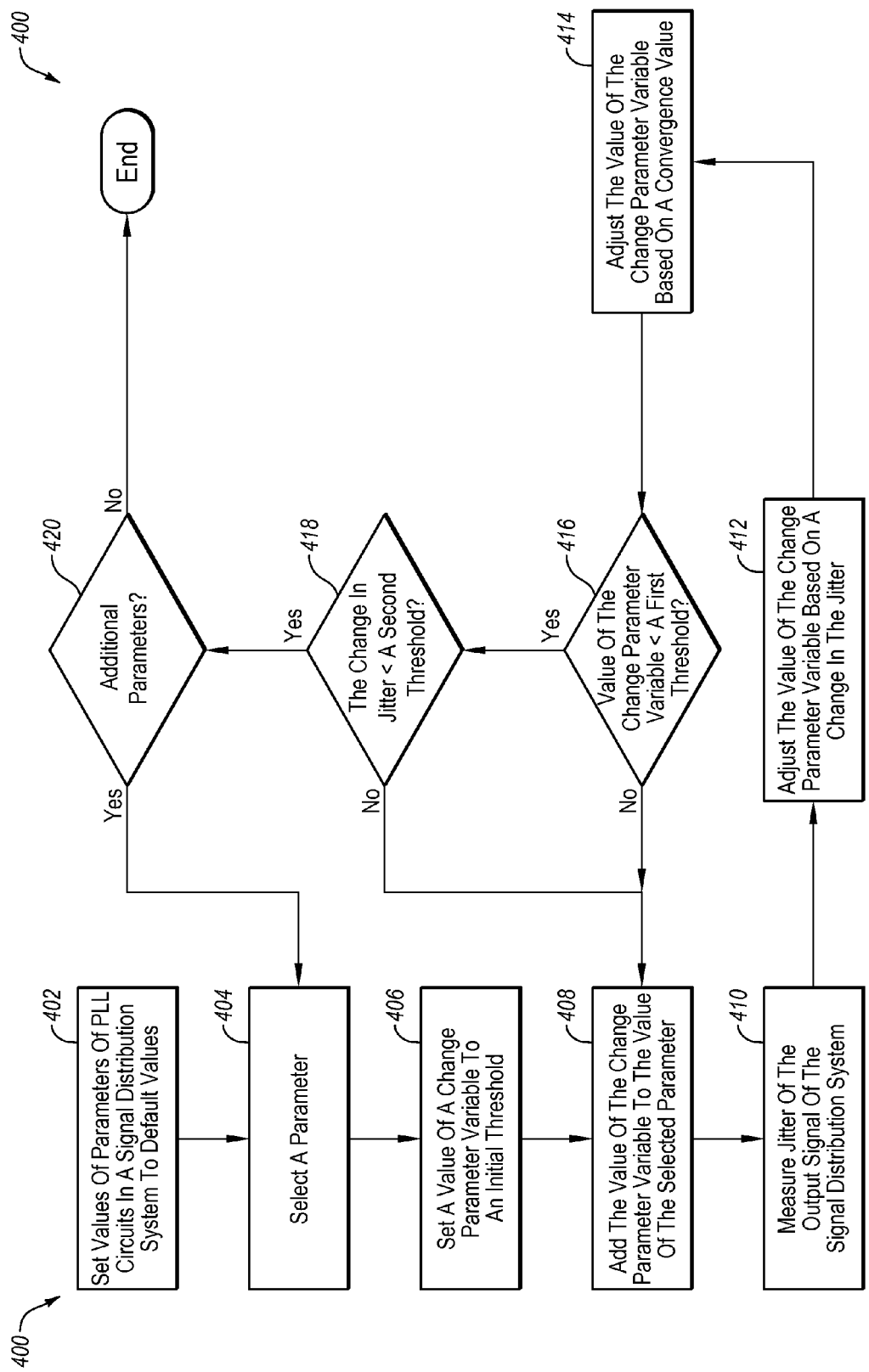
FIG. 4 is a flowchart of an example method of configuring a clock multiplication and distribution system.

FIG. 4 is a flowchart of an example method 400 of configuring a clock multiplication and distribution system, arranged in accordance with at least one embodiment described herein. The method 400 may be implemented, in some embodiments, by a clock multiplication and distribution system, such as the clock multiplication and distribution systems 100, 200, or 608 of FIGS. 1, 2, and 6. The method 400 may include adjusting one or more parameters of various PLL circuits in a clock multiplication and distribution system that may be implemented in hardware to adjust the jitter of an output clock of the clock multiplication and distribution system. The method 400 may be performed by sending information to the PLL circuits over an I²C interface, a IEEE 1149.1 (JTAG) interface, or some other hardware interface that may provide information, such as bits or bytes to the PLL circuits in the clock multiplication and distribution system.

Although illustrated as discrete blocks, various blocks may be divided into additional blocks, combined into fewer blocks, or eliminated, depending on the desired implementation.

The method 400 may begin at block 402, where values of parameters of PLL circuits in the clock multiplication and distribution system may be set to default values. The PLL circuits may include a first PLL circuit and a secondary PLL circuit. The jitter of an output clock from the secondary PLL circuit of the clock multiplication and distribution system may be measured. In block 404, a parameter from among the parameters of the PLL circuits may be selected.

In block 406, a value of a change parameter variable for the selected parameter may be set to an initial threshold. The initial threshold for the change parameter variable may be selected based on a configuration of the PLL circuits, a configuration of the clock multiplication and distribution system, and a default value of the parameters.

In block 408, a value of the change parameter variable may be added to the value of the selected parameter. In block 410, the jitter of the output clock from the secondary PLL circuit of the clock multiplication distribution system may again be measured.

In block 412, the value of the change parameter variable may be adjusted based on a change in the jitter of the output clock. In some embodiments, the value of the change parameter variable for the selected parameter may be equal to the change in the jitter divided by the value of the change parameter variable. The change in the jitter may be calculated based on the jitter measurement made in block 410 and a previous jitter measurement made before the current change to the value of the selected parameter.

In block 414, the value of the change parameter variable may be adjusted based on a convergence value. For example, the value of the change parameter variable may be multiplied by the convergence value. In these and other embodiments, the convergence value may be between 0 and 1 and may be selected based on previous iterations of the method 400. In some embodiments, the convergence value may be approximately 0.1.

In block 416, it may be determined if the value of the change parameter variable is less than a first threshold. The first threshold may be based on the minimum amount for which the value of the selected parameter may be changed. For example, for a capacitance in a loop filter, the first threshold would be based on a smallest adjustment that may be made to the capacitance of the loop filter.

When the value of the change parameter variable is less than the first threshold, the method 400 may proceed to block 418. When the value of the change parameter variable is not less than the first threshold, the method 400 may proceed to block 408.

In block 418, it may be determined if the change in jitter determined in block 414 is less than a second threshold. The second threshold may be based on a configuration of the clock multiplication and distribution system, an amount of acceptable jitter, and/or prior experience. For example, in some embodiments, a change in jitter of less than 0.5%, 1%, 3%, 5%, or 10% of a unit interval or some other amount of time may be selected.

When the change in jitter is less than the second threshold, the method 400 may proceed to block 420. When the change in jitter is not less than the second threshold, the method 400 may proceed to block 408.

In block 420, it may be determined if there are parameters of the PLL circuits in the clock multiplication and distribution system that have not been selected. When one or more of the parameters of the PLL circuits in the clock multiplication and distribution system have not been selected, the method 400 may proceed to block 404. When there are no additional parameters of the PLL circuits in the clock multiplication and distribution system to be selected, in some embodiments, the method 400 may end.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

For example, the method 400 may continue for additional secondary PLL circuits in the clock multiplication and distribution system. In these and other embodiments, the parameters from the additional secondary PLL circuits may be adjusted individually without readjusting the parameters of the first PLL circuit. Alternately or additionally, the parameters of the first PLL circuit may also be readjusted.

Method 400 illustrates one example method that may be used to adjust the parameters of PLL circuits in a clock multiplication and distribution system described herein. Multiple other types of method may also be used without departing from the scope of this disclosure.

Figure 5:
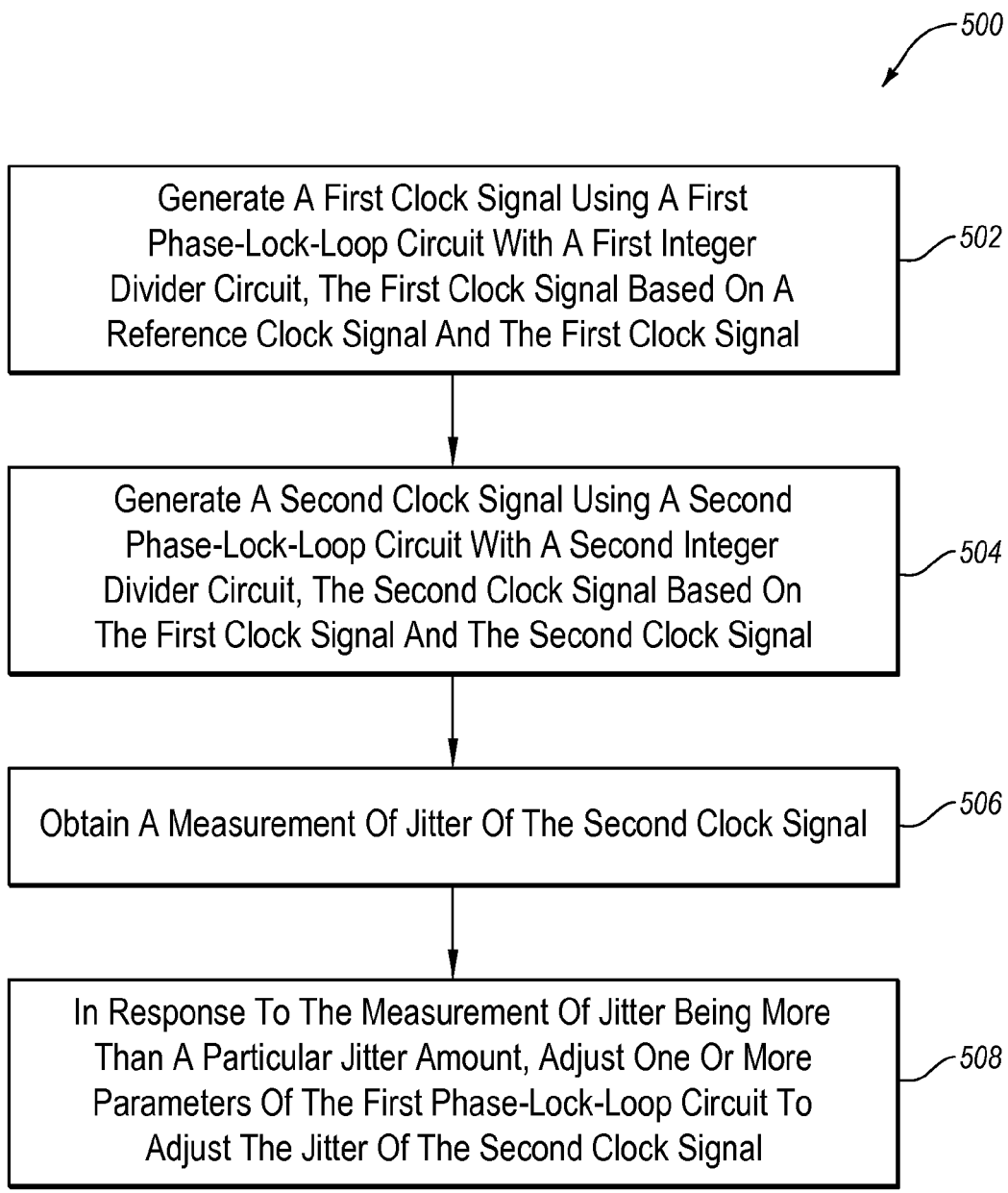
FIG. 5 is a flowchart of example method of clock multiplication and distribution.

FIG. 5 is a flowchart of an example method 500 of configuring a clock multiplication and distribution system, arranged in accordance with at least one embodiment described herein. The method 500 may be implemented, in some embodiments, by a clock multiplication and distribution system, such as the clock multiplication and distribution systems 100, 200, or 608 of FIGS. 1, 2, and 6. Although illustrated as discrete blocks, various blocks may be divided into additional blocks, combined into fewer blocks, or eliminated, depending on the desired implementation.

The method 500 may begin at block 502, where a first clock may be generated using a first phase-lock-loop circuit with a first integer divider circuit. The first clock may be based on a reference clock and the first clock.

In block 504, a second clock may be generated using a second phase-lock-loop circuit with a second integer divider circuit. The second clock may be based on the first clock and the second clock. In some embodiments, a first multiplier value of the first integer divider circuit may be greater than a second multiplier value of the second integer divider circuit.

In block 506, a measurement of jitter of the second clock may be obtained.

In block 508, in response to the measurement of jitter being more than a particular jitter amount, one or more parameters of the first phase-lock-loop circuit may be adjusted to adjust the jitter of the second clock. In some embodiments, the one or more parameters of the first phase-lock-loop circuit may include one or more of a gain of an oscillator, a gain of a phase detector, a multiplier value of the first integer divider circuit, and a loop filter parameter.

In some embodiments, the acts of the block 508 may be performed in a hardware simulation. Alternately or additionally, the acts may be performed in hardware.

In some embodiments, the method 500 may further include adjusting one or more parameters of the second phase-lock-loop circuit to adjust the jitter of the second clock in response to the measurement of jitter being more than the particular jitter amount.

In some embodiments, the measurement of the jitter of the second clock may be a first measurement of jitter. In these and other embodiments, the method 500 may further include generating a third clock using a third phase-lock-loop circuit with a third integer divider circuit. The third clock may be based on the first clock and the third clock. The method 500 may further include obtaining a second measurement of jitter of the third clock. In response to the first measurement of jitter or the second measurement of jitter being more than the particular jitter amount, the method 500 may include adjusting one or more first parameters of the first phase-lock-loop circuit, one or more second parameters of the second phase-lock-loop circuit, and one or more third parameters of the third phase-lock-loop circuit until both the first measurement of jitter and the second measurement of jitter are less than the particular jitter amount.

Figure 6:
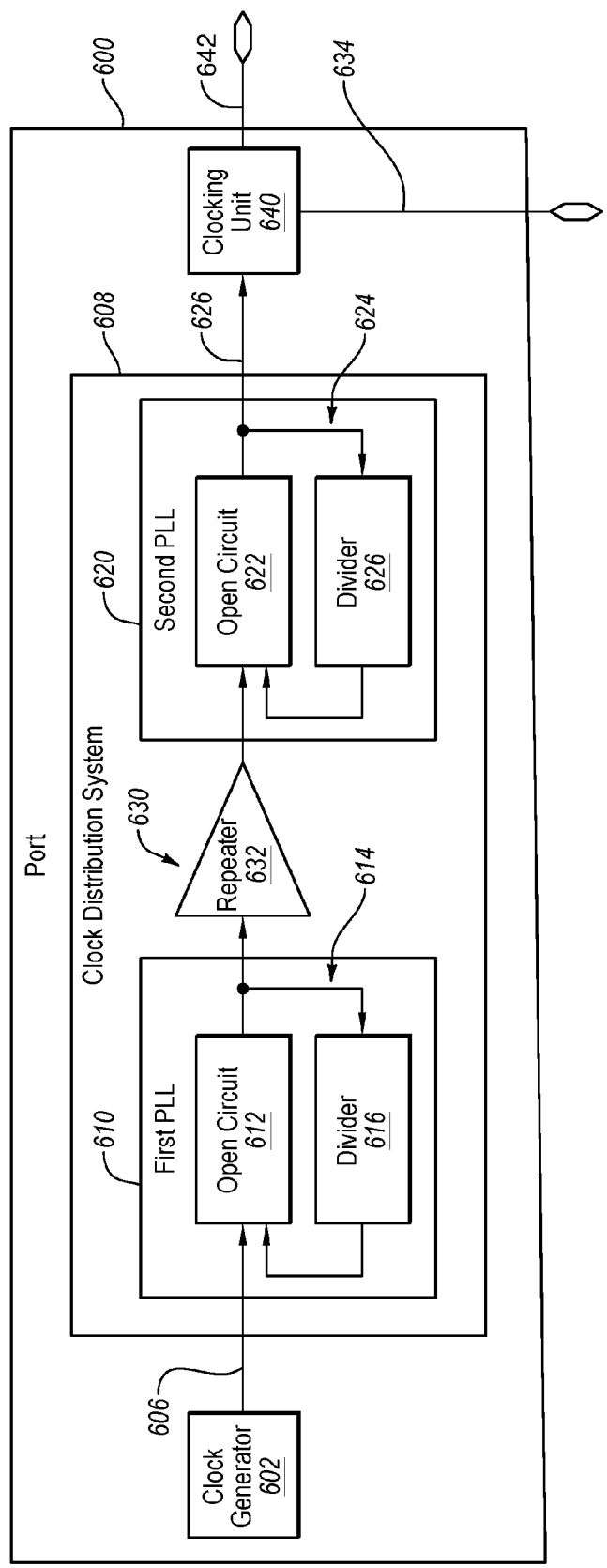
FIG. 6 is a block diagram of a high-speed input/output port that includes an example clock multiplication and distribution system

FIG. 6 is a block diagram of a high-speed input/output port 600 (referred to herein as "the port 600") that includes an example clock multiplication and distribution system 608 (referred to herein as "the system 608"), arranged in accordance with at least one embodiment described herein.

The system 608 may be analogous to the system 100 of FIG. 1 and may include a first PLL circuit 610 and a secondary PLL circuit 620. The first PLL circuit 610 may include an open loop circuit portion 612 and a feedback loop 614 that includes an integer divider circuit 616. The first PLL circuit 610, the open loop circuit portion 612, the feedback loop 614, and the integer divider circuit 616 may be analogous to the first PLL circuit 110, the open loop circuit portion 112, the feedback loop 114, and the integer divider circuit 116 of FIG. 1 and no further description is provided with respect to FIG. 6.

The secondary PLL circuit 620 may include an open loop circuit portion 622 and a feedback loop 624 that includes an integer divider circuit 626. The secondary PLL circuit 620, the open loop circuit portion 622, the feedback loop 624, and the integer divider circuit 626 may be analogous to the secondary PLL circuit 120, the open loop circuit portion 122, the feedback loop 124, and the integer divider circuit 126 of FIG. 1 and no further description is provided with respect to FIG. 6.

The system 608 may further include a clock distribution network 630 that includes a repeater 632 that electrically couples the first PLL circuit 610 and the secondary PLL circuit 620. The clock distribution network 630 and the repeater 632 may be analogous to the clock distribution network 130 and the repeater 132 of FIG. 1 and no further description is provided with respect to FIG. 6

The system 608 may be configured to generate a clock 626 based on a reference clock 606 using the first and secondary PLL circuits 610 and 620. The reference clock 606 may be generated by a reference clock generator 602. In some embodiments, the reference clock generator 602 may be an oscillating crystal circuit.

The clock 626 may be provided to a clocking unit 640 that may clock a data clock 634 using the clock 626. The clocked data clock 634 may be output by the port 600 as a data stream 642. Alternately or additionally, the data stream 642 may be received by the clocking unit 640 and may be clocked using the clock 626. In some embodiments, the port 600 may be a port in a serial link between two communicating devices.

Modifications, additions, or omissions may be made to the port 600 without departing from the scope of the present disclosure. For example, the port 600 may include multiple lanes. In these and other embodiments, the system 608 may generate a separate clock for each of the lanes using the first PLL circuit 610 that provides a first clock to multiple other secondary PLL circuits.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

All examples and conditional language recited herein are intended as pedagogical objects to aid the reader in understanding the invention and the concepts contributed by the inventor to furthering the art, and are to be construed as being without limitation to such specifically recited examples and conditions. Although embodiments of the present inventions have been described in detail, it should be understood that the various changes, substitutions, and alterations could be made hereto without departing from the spirit and scope of the invention.

What is claimed is:

1. A clock multiplication and distribution system, comprising:
    a physical first phase-lock-loop circuit that includes a first feedback loop with a first integer divider circuit, the first phase-lock-loop circuit configured to generate a first clock using a reference clock, wherein a frequency of the first clock is greater than a frequency of the reference clock;
    a physical second phase-lock-loop circuit that includes a second feedback loop with a second integer divider circuit, the second phase-lock-loop circuit configured to generate a second clock using the first clock, wherein a frequency of the second clock is greater than the frequency of the first clock, and a bandwidth of the first phase-lock-loop circuit is greater than a bandwidth of the second phase-lock-loop circuit; and
    a physical clock distribution network that electrically couples the first phase-lock-loop circuit and the second phase-lock-loop circuit.

2. The clock multiplication and distribution system of claim 1, wherein the clock distribution network includes one or more clock repeaters between the first phase-lock-loop circuit and the second phase-lock-loop circuit.

3. The clock multiplication and distribution system of claim 1, wherein the second phase-lock-loop circuit is one of a plurality of secondary stage phase-lock-loop circuits, wherein each of the secondary stage phase-lock-loop circuits includes a secondary stage feedback loop with a secondary stage integer divider circuit and is configured to generate a secondary stage clock using the first clock, and frequencies of the secondary stage clocks are approximately equal and greater than the frequency of the first clock.

4. The clock multiplication and distribution system of claim 1, wherein a first multiplier value of the first integer divider circuit is greater than a second multiplier value of the second integer divider circuit.

5. The clock multiplication and distribution system of claim 1, further comprising a control unit configured to adjust one or more parameters of each of the first phase-lock-loop circuit and the second phase-lock-loop circuit based on jitter of the second clock.

6. The clock multiplication and distribution system of claim 5, wherein the control unit is configured to adjust the one or more parameters of each of the first phase-lock-loop circuit and the second phase-lock-loop circuit until the jitter of the second clock is less than a first particular amount or a change in the jitter of the second clock is less than a second particular amount.

7. The clock multiplication and distribution system of claim 5, wherein the one or more parameters of the first phase-lock-loop circuit includes one or more of a gain of an oscillator, a gain of a phase detector, a multiplier value of the first integer divider circuit, and a loop filter parameter.

8. The clock multiplication and distribution system of claim 1, wherein the first phase-lock-loop circuit and the second phase-lock-loop circuit comprise analog phase-lock-loop circuits or all digital phase-lock-loop circuits.

9. The clock multiplication and distribution system of claim 1, wherein the clock multiplication and distribution system is included in a transceiver, the transceiver comprising:
 a reference clock generator configured to generate the reference clock; and
 a data port configured to communicate or receive data over a serial link, the data being clocked with the second clock.

10. A method, comprising:
 generating, by way of hardware simulation using a computing system, a first clock using a first phase-lock-loop circuit with a first integer divider circuit, the first clock based on a reference clock and the first clock;
 generating, by way of hardware simulation using the computing system, a second clock using a second phase-lock-loop circuit with a second integer divider circuit, wherein the second clock is based on the first clock and the second clock, and a bandwidth of the first phase-lock-loop circuit is greater than a bandwidth of the second phase-lock-loop circuit;
 obtaining, by way of hardware simulation using the computing system, a measurement of jitter of the second clock; and
 in response to the measurement of jitter being more than a particular jitter amount, adjusting, by way of hardware simulation using the computing system, one or more parameters of the first phase-lock-loop circuit to adjust the jitter of the second clock.

11. The method of claim 10, wherein in response to the measurement of jitter being more than the particular jitter amount, the method further comprising adjusting one or more parameters of the second phase-lock-loop circuit to adjust the jitter of the second clock.

12. The method of claim 10, wherein the one or more parameters of the first phase-lock-loop circuit includes one or more of a gain of an oscillator, a gain of a phase detector, a multiplier value of the first integer divider circuit, and a loop filter parameter.

13. The method of claim 10, wherein a first multiplier value of the first integer divider circuit is greater than a second multiplier value of the second integer divider circuit.

14. The method of claim 10, wherein the measurement of jitter of the second clock is a first measurement of jitter, the method further comprising:
 generating a third clock using a third phase-lock-loop circuit with a third integer divider circuit, the third clock based on the first clock and the third clock;
 obtaining a second measurement of jitter of the third clock; and
 in response to the first measurement of jitter or the second measurement of jitter being more than the particular jitter amount, adjusting one or more of: one or more first parameters of the first phase-lock-loop circuit, one or more second parameters of the second phase-lock-loop circuit, and one or more third parameters of the third phase-lock-loop circuit until both the first measurement of jitter and the second measurement of jitter are less than the particular jitter amount.

15. A clock multiplication and distribution system, comprising:
 a physical first phase-lock-loop circuit that includes a first feedback loop with a first integer divider circuit, the first phase-lock-loop circuit configured to generate a first clock using a reference clock, wherein a frequency of the first clock is greater than a frequency of the reference clock;
 a physical second phase-lock-loop circuit electrically coupled to the first phase-lock-loop circuit, wherein the second phase-lock-loop circuit includes a second feedback loop with a second integer divider circuit and is configured to generate a second clock using the first clock, wherein a frequency of the second clock is approximately equal or greater than the frequency of the first clock, and a bandwidth of the first phase-lock-loop circuit is greater than a bandwidth of the second phase-lock-loop circuit; and
 a physical control unit electrically coupled to the first phase-lock-loop circuit and the second phase-lock-loop circuit, the control unit configured to adjust one or more parameters of the first phase-lock-loop circuit or of the second phase-lock-loop circuit to adjust a jitter of the second clock.

16. The clock multiplication and distribution system of claim 15, wherein a first multiplier value of the first integer divider circuit is greater than a second multiplier value of the second integer divider circuit.

* * * * *